(12) United States Patent
Forney

(10) Patent No.: US 9,998,114 B2
(45) Date of Patent: *Jun. 12, 2018

(54) MATRIX FERRITE DRIVER CIRCUIT

(71) Applicant: Honeywell International Inc., Morristown, NJ (US)

(72) Inventor: Sean Forney, Suwanee, GA (US)

(73) Assignee: Honeywell International Inc., Morris Plains, NJ (US)

( * ) Notice: Subject to any disclaimer, the term of this patent is extended or adjusted under 35 U.S.C. 154(b) by 904 days.

This patent is subject to a terminal disclaimer.

(21) Appl. No.: 14/068,515

(22) Filed: Oct. 31, 2013

(65) Prior Publication Data

US 2015/0115737 A1 Apr. 30, 2015

(51) Int. Cl.
 *H03K 17/51* (2006.01)
 *H03K 17/00* (2006.01)
 *H03K 17/80* (2006.01)

(52) U.S. Cl.
 CPC ........... *H03K 17/51* (2013.01); *H03K 17/002* (2013.01); *H03K 17/80* (2013.01); *H03K 2217/0036* (2013.01); *Y10T 307/76* (2015.04)

(58) Field of Classification Search
 CPC ...... H03K 17/002; H03K 17/51; H03K 17/80; H03K 2217/0036; Y10T 307/76; H01L 27/00; H01L 2224/48091; H02M 3/156; H02J 7/025; H02J 7/0016; H04B 7/00
 USPC .................. 307/112–116, 325, 535
 See application file for complete search history.

(56) References Cited

U.S. PATENT DOCUMENTS

| | | | |
|---|---|---|---|
| 2,902,677 A | 9/1959 | Counihan | |
| 3,305,838 A | 2/1967 | Kidd et al. | |
| 3,585,615 A * | 6/1971 | Takahashi | G11C 27/022 365/139 |
| 3,710,280 A | 1/1973 | Buck | |

(Continued)

FOREIGN PATENT DOCUMENTS

WO 03041213 5/2003

OTHER PUBLICATIONS

European Patent Office, "Extended European Search Report from EP Application No. 14187683.9 dated Mar. 17, 2015", "from Foreign Counterpart of U.S. Appl. No. 14/068,515", dated Mar. 17, 2015, pp. 1-4, Published in: EP.

(Continued)

*Primary Examiner* — Rexford Barnie
*Assistant Examiner* — Elim Ortiz
(74) *Attorney, Agent, or Firm* — Fogg & Powers LLC

(57) ABSTRACT

A ferrite module matrix driver circuit comprises a controller, a charging circuit, a plurality of ferrite modules arranged in the form of a matrix, a plurality of first switches driven by the controller, a plurality of second switches driven by the controller, and one or more comparators coupled to the charging circuit and the controller. Each switch in the first plurality of switches connects a respective column of said plurality of ferrite modules to the charging circuit. Each switch in the second plurality of switches connects a respective row of said plurality of ferrite modules to ground. And, after a specific voltage has been reached by the charging circuit, one of the comparators signals to the controller, which in turn selects a specific ferrite module to be polarized by driving one of the plurality of first switches and one of the plurality of second switches.

20 Claims, 5 Drawing Sheets

(56) References Cited

U.S. PATENT DOCUMENTS

| | | | | |
|---|---|---|---|---|
| 3,751,825 | A * | 8/1973 | Barrett | G09B 13/00 340/286.13 |
| 4,355,210 | A * | 10/1982 | Soulliard | H04M 1/505 327/105 |
| 4,401,861 | A * | 8/1983 | Braun | H04Q 3/521 327/325 |
| 4,490,700 | A * | 12/1984 | Stern | H01P 1/23 333/102 |
| 4,618,831 | A * | 10/1986 | Egami | H01P 5/16 330/124 D |
| 4,772,886 | A | 9/1988 | Hasegawa | |
| 5,160,934 | A * | 11/1992 | Alpers | F41G 7/2266 342/351 |
| 5,568,088 | A * | 10/1996 | Dent | H03F 1/0294 330/124 R |
| 5,610,556 | A * | 3/1997 | Rubin | H03F 3/602 330/124 D |
| 5,872,481 | A * | 2/1999 | Sevic | H03F 1/0277 330/124 R |
| 6,591,816 | B2 | 7/2003 | McCoy et al. | |
| 6,774,600 | B2 | 8/2004 | Weinbrenner | |
| 6,898,428 | B2 * | 5/2005 | Thorburn | H04B 7/2045 370/316 |
| 8,304,671 | B2 * | 11/2012 | Fukushima | G06F 3/03545 178/19.03 |
| 9,166,267 | B2 * | 10/2015 | Kroening | H01P 1/39 |
| 9,601,064 | B1 | 3/2017 | Amarillo | |
| 2001/0021558 | A1 * | 9/2001 | Sato | G11C 29/12 438/286 |
| 2010/0091688 | A1 * | 4/2010 | Staszewski | H03D 7/1441 370/277 |
| 2011/0128762 | A1 * | 6/2011 | Ripley | H02M 3/07 363/62 |
| 2013/0331026 | A1 * | 12/2013 | O'Neill | H04B 7/18515 455/12.1 |
| 2014/0225666 | A1 * | 8/2014 | Kusu | H03F 1/0277 330/124 D |
| 2016/0006431 | A1 | 1/2016 | Forney | |

OTHER PUBLICATIONS

European Patent Office, "Extended European Search Report from EP Application No. 15171073.8", "from Foreign Counterpart of U.S. Appl. No. 14/321,229", dated Nov. 17, 2015, pp. 1-10, Published in: EP.

United States Patent and Trademark Office, "Notice of Allowance", "From U.S. Appl. No. 14/321,229", dated Sep. 8, 2017, pp. 1-37, Published in: US.

United States Patent and Trademark Office, "Corrected Notice of Allowability", "From U.S. Appl. No. 14/321,229", dated Nov. 6, 2017, pp. 1-11, Published in: US.

* cited by examiner

MATRIX FERRITE DRIVER CIRCUIT

BACKGROUND

In certain communication networks, certain communication nodes in the network are not easily accessible for repairs in the event that equipment on the communication node experiences a failure. For example, communication nodes located in space are practically inaccessible and, as such, that failed equipment cannot be repaired. To prevent the failures from affecting the operation of the communication node, the communication equipment of the communication node includes standby equipment that increases the redundancy of any communication paths through the communication equipment. To control which communication paths are used through the communication equipment, a switch network is used to switch a communication path from failed equipment to standby equipment.

An example of a component in a switch network that is prone to failure is a low noise amplifier (LNA). Because LNAs are prone to failure, a communication node will include a number of spare amplifiers. For example, at any given time, the communication node may use at most M amplifiers, but the communication equipment may include N amplifiers such that when any of the M amplifiers experiences a failure, the switch network switches the communication path through one of the N amplifiers that is not currently active and switches the communication path away from the amplifier that failed. Other examples include redundant antenna systems and other RF redundancy schemes.

Often times, ferrite switches are used as switches in these switch networks for the variety of benefits they offer. Ferrite-based switches, as opposed to electro-mechanical switches, are often used in redundancy schemes in space because at higher frequencies ferrite-based switches decrease in size, whereas electro-mechanical switches do not. They are also reliable because there are no moving parts required, as opposed to the moving parts required in a mechanical switch.

SUMMARY

In one embodiment, a ferrite module matrix driver circuit is provided. The ferrite module matrix driver circuit comprises a controller, a charging circuit, a plurality of ferrite modules arranged in the form of a matrix, a plurality of first switches driven by the controller, a plurality of second switches driven by the controller, and one or more comparators coupled to the charging circuit and the controller. Each switch in the first plurality of switches connects a respective column of said plurality of ferrite modules to the charging circuit. Each switch in the second plurality of switches connects a respective row of said plurality of ferrite modules to ground. And, after a specific voltage has been reached by the charging circuit, one of the one or more comparators signals to the controller, which in turn selects a specific ferrite module to be polarized by driving one of the plurality of first switches and one of the plurality of second switches.

DRAWINGS

The drawings depict only exemplary embodiments and are not therefore to be considered limiting in scope. The exemplary embodiments will be described with additional specificity and detail through the use of accompanying drawings, in which.

Figure 1A:
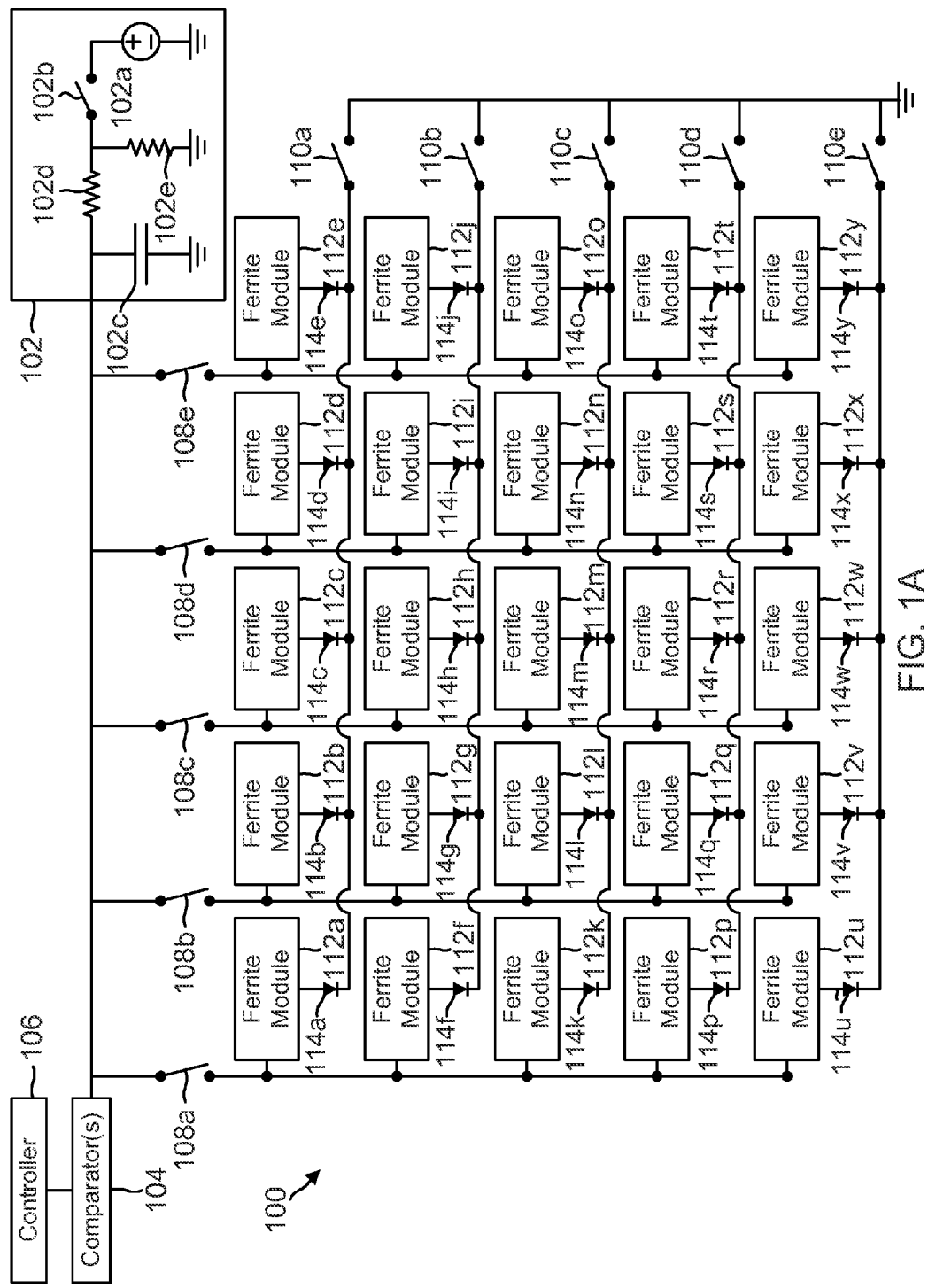
FIGS. 1A-1B illustrate an example embodiment of a matrix ferrite driver circuit.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following description is, therefore, not to be taken in a limiting sense.

FIG. 1A is a block diagram of an example matrix ferrite driver circuit 100. The matrix ferrite driver circuit 100 includes a charging circuit 102, one or more comparators 104, a controller 106, a plurality of first switches 108a-108e, a plurality of second switches 110a-110e, a plurality of ferrite modules 112a-112y, and a plurality of diodes 114a-114y.

The circuit 100 can be operated in the following way. To polarize one of a plurality of ferrite modules 112a-112y, the circuit 100 begins by charging the charging circuit 102. An example of a charging circuit includes a power source 102a, a switch 102b, a set of resistors 102d-102e, and a capacitor 102c. The charging circuit 102 in this example begins to charge to a specific voltage when a controller 106 signals to a switch 102b in the charging circuit 102 to close. After the switch 102b is closed, a power source 102a starts to charge the capacitor 102c. Once the capacitor 102c reaches a specified voltage, one of the one or more comparators 104 signals to the controller 106 that the charging circuit 102 has reached the specified voltage. After the capacitor 102c reaches the specified voltage, the controller 106 drives the switch 102b to open.

The charging circuit 102 can be charged to a number of different voltages by inserting into the circuit 100 multiple comparators 104 that have different voltage designations. After the controller 106 has received a signal from a comparator 104 indicating that the charging circuit 102 has reached a specific voltage, the controller 106 drives one of a plurality of second switches 110a-110e to close. As can be seen in FIG. 1A, each row of ferrite modules 112a-112y is coupled to a plurality of second switches 110a-110e that are connected to ground. In an example, assume ferrite module 112x needed to be polarized. In this example, the controller 106 would drive switch 110e to close. Once the controller 106 drives one of the plurality of second switches 110a-110e to close, the controller 106 then drives one of a plurality of first switches 108a-108e to close. As can be seen in FIG. 1A, each column of ferrite modules 112a-112y is connected to the charging circuit 102. In an example, assume again that ferrite module 112x needed to be polarized; in this example, after the controller 106 had driven switch 110e to close, the controller 106 would then drive switch 108d to close. After the controller 106 drives one of the plurality of first switches 108a-108e to close, the capacitor 102c discharges a current pulse across the selected ferrite module, which in turn polarizes the ferrite element. The diodes 114a-114y in the circuit 100 will prevent the wrong ferrite module from being polarized. For example, assuming that ferrite module 112x needed to be polarized, the diodes 114u-114w and 114y would prevent the current pulse from entering ferrite modules 112u-112w and 112y. After one of the plurality of ferrite modules 112a-112y is polarized, the controller 106 drives the plurality of first switches 108a-108e and the plurality of second switches 110a-110e to open. If another ferrite module 112a-112y needed to be polarized, then the process is repeated with the capacitor 102c being charged to the specific voltage needed to polarize the specific ferrite module, and the controller 106 would then drive the corresponding row and column switches for the specific ferrite module to close.

As mentioned above, the controller 106 drives the switches in the circuit. Specifically, it drives the switch 102b in the charging circuit 102, the plurality of first switches 108a-108e and the plurality of second switches 110a-110e. A controller drives a switch by controlling whether the switch is to close or open. The controller 102 can include a microcontroller, microprocessor (e.g., a digital signal processor (DSP)), field programmable switch array (FPGA), application specific integrated circuit (ASIC), a central processing unit (CPU) coupled to a memory device or other programmable device. In an example, assume that ferrite module 112n needed to be polarized. After the charging circuit 102 was charged to a specific voltage, the controller would drive switches 110c and 108d to close. After the switches were driven closed, a current pulse equal to the amount of energy stored in the charging circuit 102 would travel across ferrite module 112n, polarizing the ferrite element. In this example, the diodes 114k-114m and 114o would prevent the current pulse from travelling through ferrite modules 112k, 112l, 112m, and 112o.

The charging circuit 102 is any circuit capable of charging to one or more selectable voltage levels. In an example, the charging circuit 102 consists of a power supply 102a coupled to a switch 102b, a capacitor 102c, and resistors 102d-102e. As mentioned above, the charging circuit 102 operates when the controller 106 drives the switch 102b to close. Once the switch 102b is closed, the power source 102a starts to charge the capacitor 102c. After the capacitor 102c reaches a specific voltage, one of the one or more comparators 104 signals to the controller 106 to drive switch 102b to open. At this point, the charging circuit 102, and more specifically the capacitor 102c, is ready to be used by the matrix ferrite driver circuit. The circuit 100 can check if the charging circuit 102 is charging correctly by turning on the charging circuit 102 and then verifying that the one or more comparators 104 indicate that the capacitor 102b has charged according to its resistor-capacitor (RC) time constant. In addition, the charging circuit 100 can check if the charging circuit 102 is discharging correctly by charging the charging circuit 102 to a specific voltage, turning off the charging circuit 102, and then verifying that the one or more comparators 104 indicate that the capacitor 102b has been discharged in the expected amount of time, given the energy required to switch the ferrite module.

The ferrite modules 112a-112y can be any type of ferrite switch. Further, it is to be understood that the number of ferrite modules shown in FIG. 1A is provided by way of example only and that the circuit 100 can include any number of ferrite modules. The number of ferrite modules, in some embodiments, can depend on the number of inputs and outputs the system requires as discussed below under FIG. 3A. In an example the ferrite modules 112a-112y can be ferrite circulators, which connect to one another to provide switching capabilities between a number of module inputs and module outputs. In certain examples, the ferrite circulators may be waveguide circulators, where each circulator has three arms at 120° that meet in a common junction. The common junction of the three arms is loaded with ferrite, a non-reciprocal material. When a magnetizing field is created in the ferrite element that is located at the common junction, a gyromagnetic can be used to switch the microwave signal from one waveguide arm to another. By reversing the direction of the magnetizing field, the direction of switching between the waveguide is reversed. Thus, a ferrite switching circulator is functionally equivalent to a fixed-bias circulator but has a selectable direction of circulation. Radio Frequency (RF) energy can be routed with low insertion loss from one waveguide arm to either of the two outputs arms. If one of the waveguide arms is terminated in a matched load, then the circulator acts as an isolator, with high loss in one direction of propagation and low loss in the other direction. Reversing the direction of the magnetizing field will reverse the direction of high and low isolation.

As discussed above, the plurality of first switches 108a-108e and the plurality of second switches 110a-110e are driven by the controller 106 to either open or closed. The plurality of first switches 108a-108e connects a respective column of said plurality of ferrite modules 112a-112y to the charging circuit. More specifically, one switch of the plurality of first switches 108a-108e connects one column of the ferrite modules 112a-112y to the charging circuit 102. Thus, the number of first switches depends on how many columns of ferrite modules 112a-112y there are in the circuit. In FIG. 1A, since there are five columns of ferrite modules, there are five first switches. The plurality of second switches 110a-110e connects a respective row of said plurality of ferrite modules 112a-112y to ground. In particular, one switch of the plurality of second switches 110a-110e connects one row of the ferrite switches 112a-112y to ground. Thus, the number of second switches depends on how many rows of ferrite modules 112a-112y there are in the circuit. In FIG. 1A, since there are five rows of ferrite modules, there are five second switches. The plurality of first switches 108a-108e and the plurality of second switches 110a-110e can be any type of switch that can be controllable by the controller 106. In an example, the plurality of first switches 108a-108e are P-channel field effect transistors (FETs). In another example, the plurality of first switches 108a-108e are PNP transistors. In another example, the plurality of second switches 110a-110e are N-channel FETs. In another example, the plurality of second switches 110a-110e are NPN transistors.

In addition, the plurality of first switches 108a-108e and the plurality of second switches 110a-110e can be checked by the circuit 100 to make sure they are operating properly. After the charging circuit 102 is checked to make sure it is charging and discharging correctly, as described above, to check the plurality of second switches 110a-110e, the charging circuit 102 is charged to a specific voltage and then one or more of the plurality of first switches 108a-108e is turned on. When one of the one or more comparators 104 indicates that the capacitor 102b has been discharged, the time it took for the capacitor 102b to discharge is compared against the expected discharge time for the capacitor 102b given by the RC time constant of the capacitor 102b. To check the plurality of first switches 108a-108e, the charging circuit 102 is charged to a specific voltage and then one or more of the plurality of second switches 110a-110e is turned on.

When one of the one or more comparators 104 indicates that the capacitor 102b has been discharged, the time it took for the capacitor 102b to discharge is compared against the expected discharge time for the capacitor 102b given by the RC time constant of the capacitor 102b.

The one or more comparators 104 are coupled to the charging circuit 102 and the controller 106. As mentioned above, after a specific voltage has been reach by the charging circuit 102, one of the one or more comparators 104 signals to the controller 106 that a specific voltage has been reached. Despite having only one block for the controller 104 in FIG. 1A, there can be multiple comparators 104 that will signal to the controller 106 when different voltages have been reached by the charging circuit 102. The reason for having multiple comparators 104 is because the ferrite modules may have different electrical characteristics such as resistance and inductance, and therefore may require a different level of energy to switch. Hence, the different voltages levels can be assigned according to how much energy is required to switch each of the ferrite modules. The same comparator, therefore, can be assigned to one or more ferrite modules that have similar levels of energy required to switch them. In an example, a comparator can signal to the controller when the capacitor has been discharged. In an example, a comparator can signal to the controller when the capacitor has been charged to a voltage level greater than 0 volts.

Figure 1B:
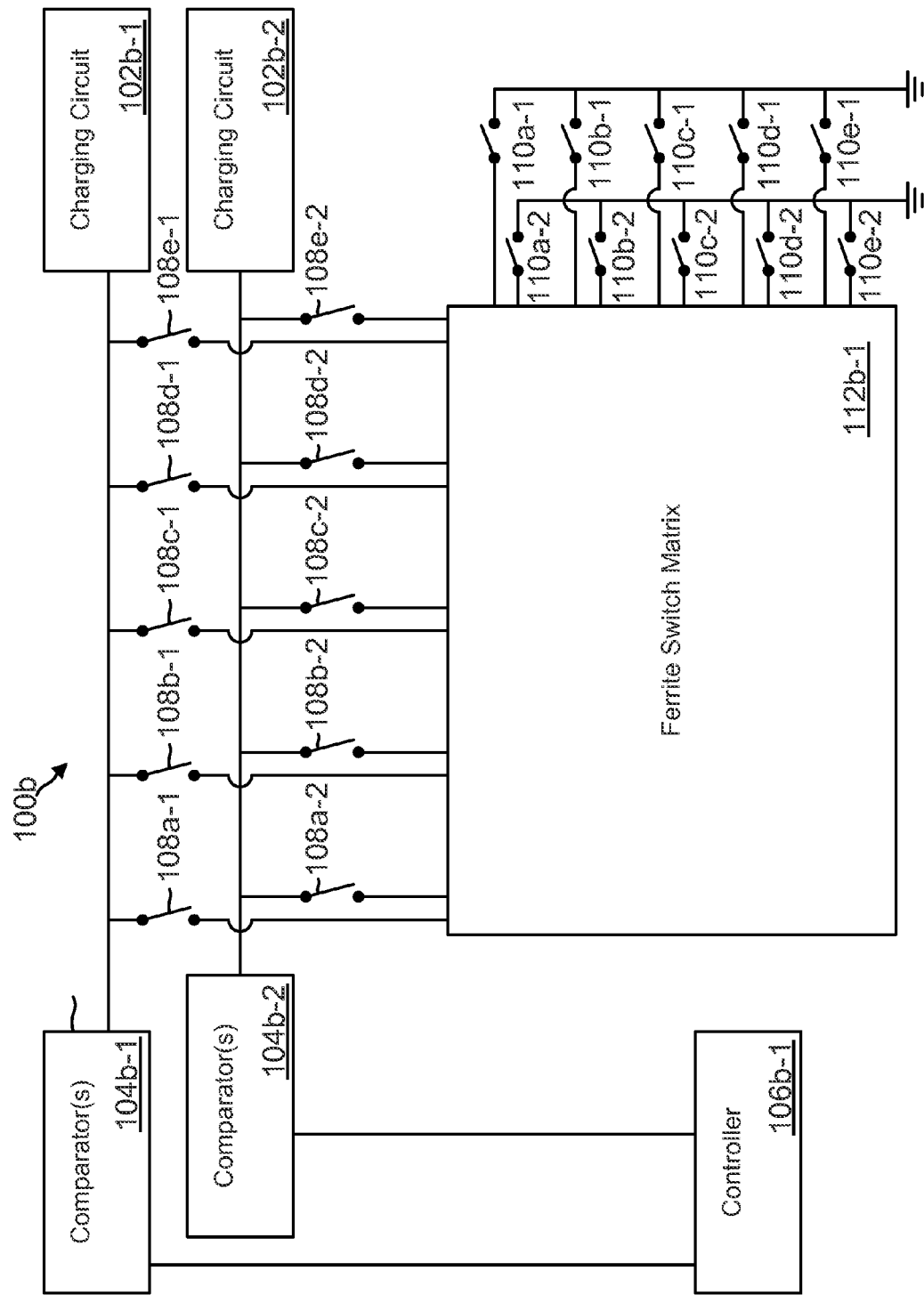

The design in FIG. 1A shows a circuit capable of polarizing the ferrite modules to a first polarity. In order to polarize the ferrite modules to a second polarity, which is opposite the first polarity, the design shown in FIG. 1A is replicated with the all the components shown, except for the controller and the ferrite modules, which are shared between the two circuits. This is shown in FIG. 1B. Each of the components in FIG. 1B operates as described with respect to FIG. 1A. That is, the charging circuit 106b-1 in FIG. 1B operates in the same way as the controller 106 in FIG. 1A operates. The charging circuits 102b-1 and 102b-2 in FIG. 1B operate in the same way as the charging circuit 102 in FIG. 1A operates. The first plurality of switches 108a-1-108e-2 in FIG. 1B operate in the same way as the first plurality of switches 108a-108e in FIG. 1A operates. The second plurality of switches 110a-1-110e-2 in FIG. 1B operate in the same way as the second plurality of switches 110a-110e in FIG. 1B operates. In this example, the switches 108a-1 and 108a-2 are connected to the same column of the ferrite switch matrix, switches 108b-1 and 108b-2 are connected to the same column of the ferrite module, etc. Similarly, the switches 110a-1 and 110a-2 are connected to the same row of the ferrite switch matrix, the switches 110b-1 and 110b-2 are connected to the same row of the ferrite switch matrix, etc. The ferrite switch matrix 112b-1 in FIG. 1B encompasses the diodes 114a-114y and the ferrites modules 112a-112y in FIG. 1A. As noted above, however, the diodes 114a-114y in the ferrite switch matrix in FIG. 1A need to be replicated for each polarity of a ferrite module, so in the ferrite switch matrix 112b-1, there are two diodes for each of the ferrite modules 112a-112y. The ferrite modules in the ferrite switch matrix 112b-1 operate in the same way as the ferrite modules 112a-112y in FIG. 1 operate. Moreover, the comparators 104b-1 and 104b-2 in FIG. 1B operate as the comparator 104 operates in FIG. 1A. Note, however, the difference in the way the comparators 104b-1, 104b-2 are coupled is that the latch wires through the ferrite toroids are connected in reverse order. This allows the current pulse to flow in an opposite direction, which polarizes it to a second polarity. The circuits all function in the same manner, but by virtue of connecting the latch wires in opposite directions, the current can be controlled in either direction.

Figure 2:
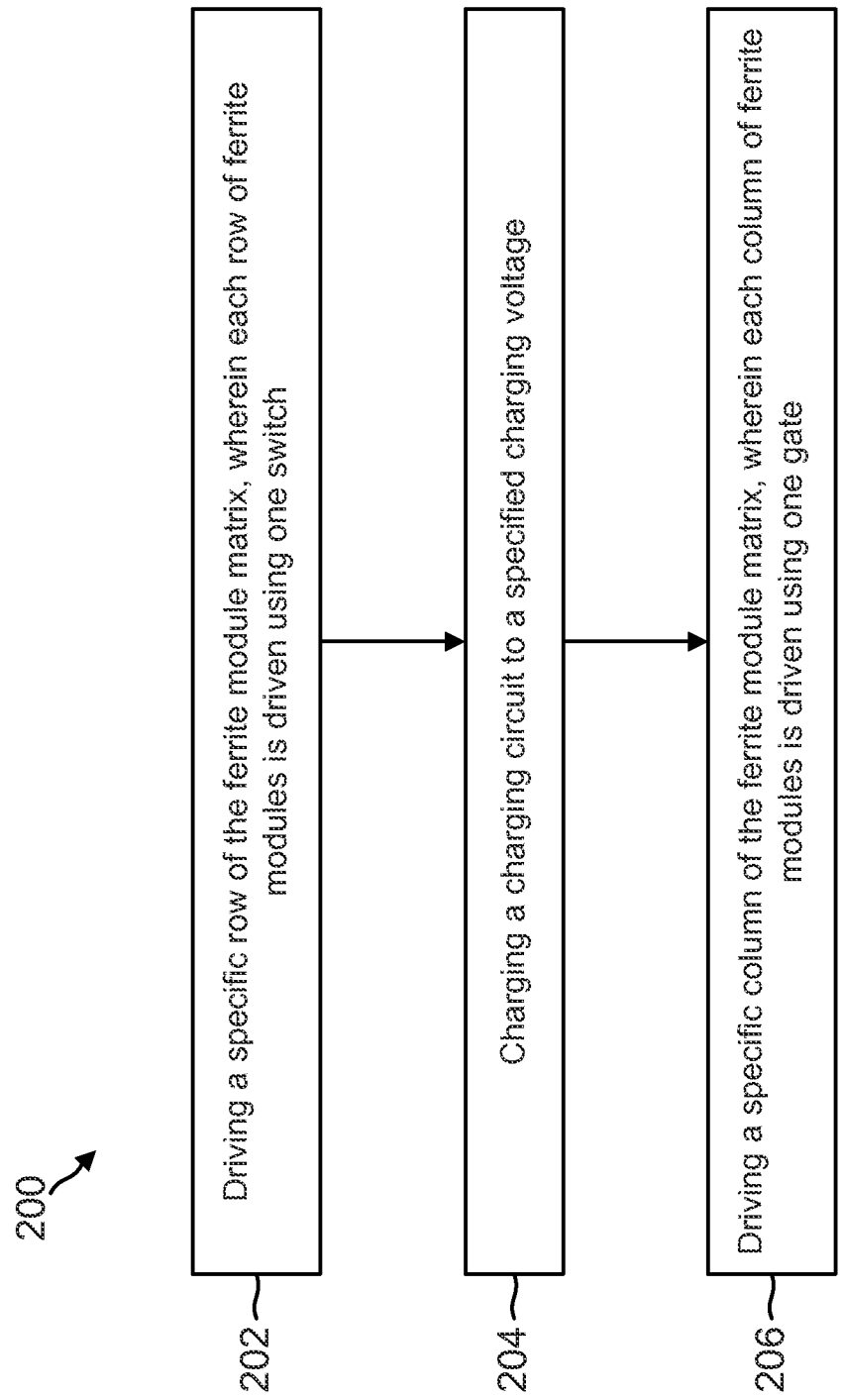
FIG. 2 is a flow diagram of an example of a method for driving several ferrite modules.

FIG. 2 is a flow diagram of a method 200 for driving a ferrite module that is in a matrix of ferrite modules, such as ferrite modules 112a-112y. The method 200 begins by coupling a selected row of the ferrite module matrix to ground, wherein, for each ferrite module polarity, each row of the ferrite modules is coupled to ground using a single respective first switch of a plurality of first switches, such as switches 110a-110e in FIG. 1A above (block 202). That is, for a ferrite module's first polarity, a selected row of the ferrite module matrix is coupled to ground using a single respective first switch of a plurality of first switches, operated by a controller, such as controller 106. The row selected is the row that ferrite module is in and the polarity selected is based on the desired current flow to the ferrite modules. At any given time, only one switch in the plurality of switches 110a-1-110e-2 is ever connected to ground based on the desired row and polarity. For example, in order to drive the third row of the plurality of ferrite modules in FIG. 1B, the controller 106 would close either switch 110c-1 or switch 110c-2, depending on the desired polarity. In an example, the plurality of first switches can be N-channel field-effect transistors (FETs). In another example, the plurality of first switches can be NPN transistors.

After the switch corresponding to the specific row is closed, a charging circuit, such as charging circuit 102, is charged to a specified voltage (block 204). As mentioned above, the charging circuit can be any type of circuit capable of charging to one or more selectable voltage levels. To charge the charging circuit to a specified voltage, the charging circuit is first turned on by a controller. As an aside, any number of charging circuits can be turned on and off using a single controller coupled to the multiple charging circuits. In most embodiments, however, there will only be two charging circuits in any design as there will only be two polarities. Further, only one of these charging circuits would be active at any given time, depending on the desired polarity. In an example, assume that the charging circuit is configured in the same way as the charging circuit 102 in FIG. 1A. That is, the charging circuit is configured with a power source, such as power source 102a; a switch, such as switch 102b; a capacitor, such as capacitor 102c; and resistors, such as resistors 102d-102e. In this example, the charging circuit is turned on after a controller drives the switch 102b to close. Once the switch closes, the power source starts to charge the capacitor. After the charging circuit is turned on in block 204, the controller, such as controller 106, waits for an assigned comparator, such as comparator 104, to indicate that a specific charging voltage has been reached by the charging circuit. The specific charging voltage can be any voltage and can include zero volts, as well. Finally, in block 204, after the charging circuit reaches a specified charging voltage, the charging circuit is then turned off by a controller. In an example, assume again that the charging circuit is configured in the same way as the charging circuit 102 in FIG. 1A. The charging circuit in this example is turned off when the controller 106 drives the switch 102b to open.

Once the charging circuit is turned off, a selected column of the ferrite module matrix is coupled to the charging circuit in order to discharge the specified charging voltage across a selected ferrite module, identified by the selected row and the selected column. The column selected is the column that ferrite module is in. For example, in FIG. 1, if ferrite module 112u needed to be polarized, then column 108a would be the column selected by the controller. Additionally, each column of ferrite modules is coupled to the charging circuit using a single respective second switch of a plurality of second switches (block 206). That is, a specific column of switches, such as the column of switches 108a-108e in FIG. 1A, is coupled to the charging circuit by closing the corresponding switch to the specific column, using a controller. For example, if the plurality of ferrite modules is arranged in the form of a matrix such as the matrix shown in FIG. 1A, in order to couple the third column of the plurality of ferrite modules 112a-112y in FIG. 1A, the controller 106 signals to switch 108c to close. In an example, the first plurality of switches can be P-channel field-effect transistors (FETs). In addition, block 206 can include waiting a predetermined amount of time after coupling the specific column of the ferrite module matrix to the charging circuit. In an example, the waiting time can correspond to the expected amount of time required for the capacitor in the charging circuit to discharge, given the energy required to switch the ferrite module. Further, block 206 can include verifying, using comparators, that the capacitor in the charging circuit has been fully discharged. Additionally, block 206 can include decoupling all of the first plurality of switches and all of the second plurality of switches 110a-110e after driving a column of the ferrite module matrix and waiting a predetermined amount of time.

Figure 3A:
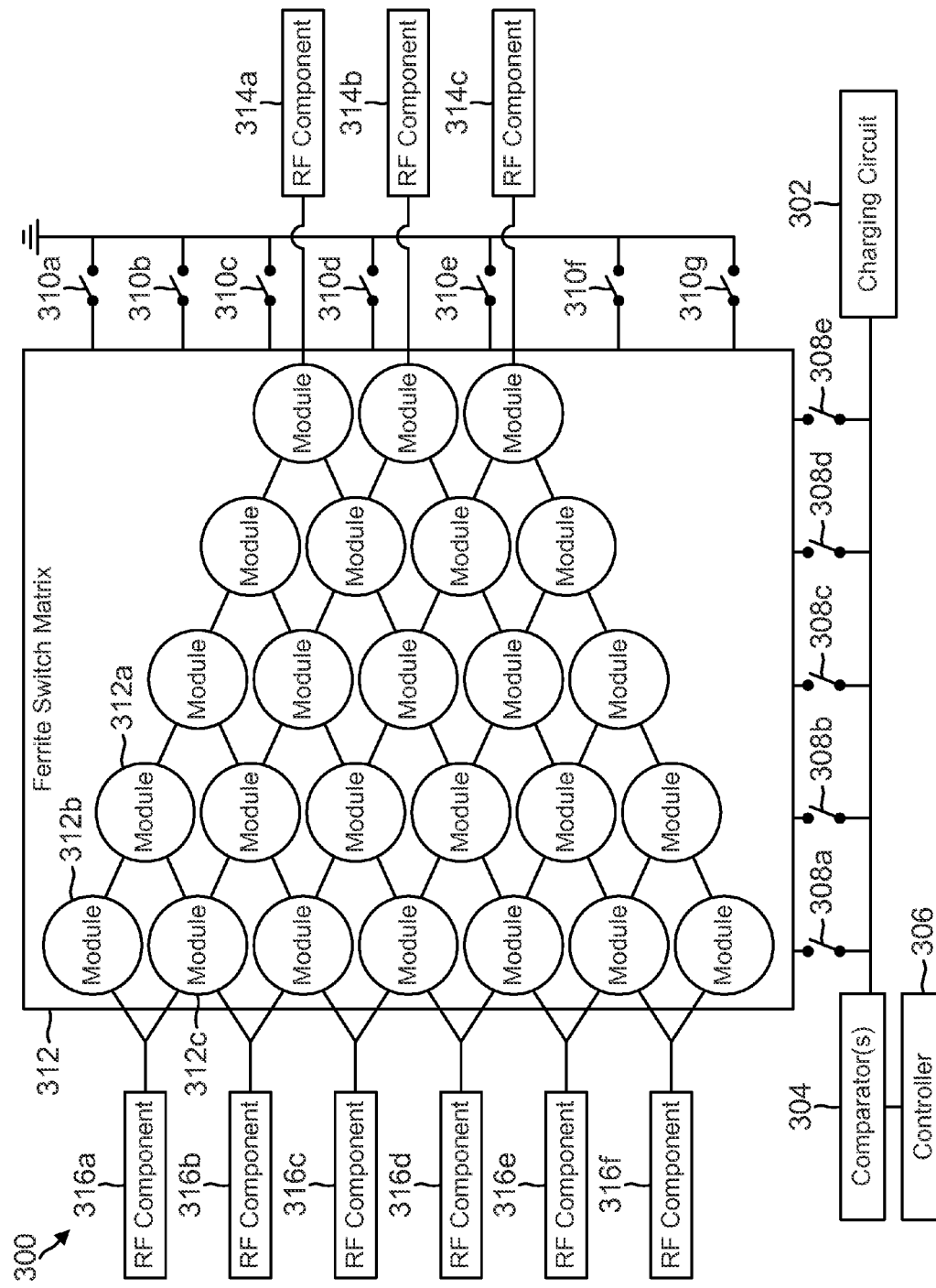
FIGS. 3A-3B illustrate an example embodiment of a system incorporating a matrix ferrite driver circuit.

FIG. 3A is a block diagram of an example of a system 300 which implements a matrix ferrite driver circuit. System 300 can be implemented as any radio frequency (RF) system that incorporates redundancy schemes such as, but not limited to, satellite communication systems. System 300 includes one or more first radio frequency (RF) components 314a-314c, one or more second radio frequency (RF) components 316a-316f and a ferrite module matrix driver circuit, such as the circuit 100 discussed above. Note in FIG. 3A that the paths connecting the RF components are shown and that the connections from the first switches 308a-308e and the second switches 310a-310g to the ferrite modules are not shown, for purposes of illustration, but are still present.

Although the one or more RF components 314a-314c shown in the exemplary FIG. 3A includes three RF components, it is to be understood that any number of RF components can be used in other embodiments. In at least one example, each of the one or more RF components 314a-314c can be implemented as one of a transmitter, a receiver, an antenna, or other load know to one of skill in the art. Similarly, while the one or more RF components 316a-316f shown in FIG. 3A include six RF components, it is to be understood that any number of RF components can be used in other embodiments. Further, these RF components can be any redundancy scheme of RF components in some embodiments. An example being a redundant scheme of amplifiers.

The ferrite load matrix driver circuit components discussed above and incorporated in this system consists of a controller 306, a charging circuit 302, a plurality of ferrite modules 312 arranged in the form of a matrix configured to connect the one or more first RF components 314a-314c to the one or more second RF components 316a-316f, a plurality of first switches 308a-308e driven by the controller 306, wherein each switch in the plurality of first switches 308a-308e connects (not shown, as discussed above) a respective column of said plurality of ferrite modules 312 to the charging circuit 302, a plurality of second switches 310a-310g driven by the controller 106, wherein each switch in the plurality of second switches 310a-310g connects (not shown, as discussed above) a respective row of said plurality of ferrite modules to ground, and one or more comparators 304 coupled to the charging circuit 302 and the controller 306, wherein after a specific voltage has been reached by the charging circuit 302, one of the one or more comparators 304 signals to the controller 306, which in turn selects a specific ferrite module from the plurality of ferrite modules 312 to be polarized by driving one of the plurality of first switches 308a-308e and one of the plurality of second switches 310a-310g. The discussion of the components of the ferrite module matrix driver circuit 100 discussed above apply to the components in this system as well and are incorporated herein.

Figure 3B:
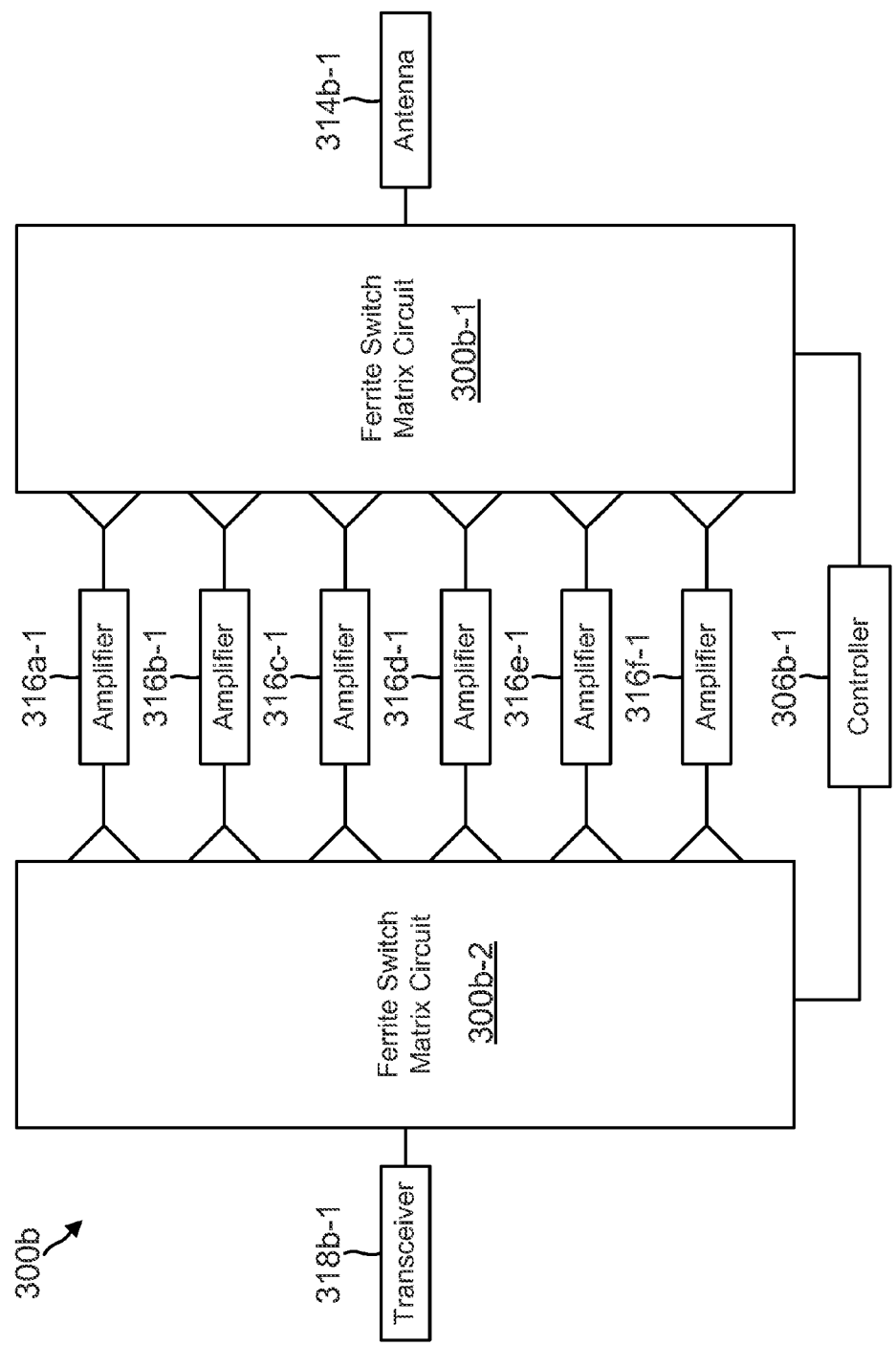

In an example, system 300 can be part of a communication node that transmits and receives signals, like the one shown in FIG. 3B. In FIG. 3B, the ferrite switch matrix circuits 300b-1 and 300b-2 are have the same components, and operate similarly, as the circuit 100 shown in FIG. 1, except that the ferrite switch matrix circuits 300b-1 and 300b-2 share a single controller 306b-1. In this example, one of the one or more first RF components 314a-314c in FIG. 3A is an antenna, such as the antenna 314b-1 in FIG. 3B and that the one or more RF components 316a-316f in FIG. 3A are amplifiers, such as the amplifiers 316a-1-316f-1 in FIG. 3B. In at least one example, the amplifiers can be low-noise amplifiers (LNA), power amplifiers, a travelling wave tube amplifier, or the like. In this example, the system 300b can operate by receiving a signal through an antenna 314b-1, which is then routed by the ferrite switch matrix circuit 300b-1 to one of the amplifiers 316a-316f. An amplifier amplifies the signal which is then routed by another ferrite switch matrix circuit 300b-2 to a transceiver 318b-1 that processes the signal. In another example, an amplifier 316a-316f amplifies a signal received from a ferrite switch matrix 300b-2 that was processed by a transceiver 318b-1, which is then routed by the ferrite switch matrix circuit 300b-1 to an antenna 314b-1 for radiation to another communication node in the communication network.

In some examples, the system 300 is implemented on a platform that is inaccessible for repairs when a component on the system experiences a fault. For example, the system 300 may be implemented on a satellite located in space or other inaccessible location. In at least one example, an amplifier 316a-316f in the system 300 may experience a failure during the life of the system 300. To prevent the failure from negatively affecting the operation of the system 300, when the system 300 begins operation, the system 300 may include multiple amplifiers 316a-316f, where a portion of the amplifiers 316a-316f function as standby amplifiers in the event that an operating amplifier fails. When an operating amplifier fails, the ferrite switch matrix 312 changes a communication path that passes through the failed amplifier to pass through a standby amplifier.

In an example, FIG. 3A components are the following: RF component 316a is an operational amplifier, RF component 316b is a standby amplifier, ferrite modules 312a-312c are ferrite circulator modulators and ferrite module 312a is connected to switch 310a and switch 308b. Additionally, in this example, operational amplifier 316a has a fault. In this example, the controller 306 would close switch 310a and start charging the charging circuit 302. After the charging circuit 302 reached the specific voltage required to magnetize ferrite module 312a, i.e., so that the output of ferrite module 312a would switch from its waveguide arm leading to ferrite module 312b to its waveguide arm leading to ferrite module 312c, the comparator 304 would signal to the controller 306 that the specified voltage has been reached. At which time, the controller 306 would have the charging circuit 302 stop charging and would close switch 308b. The charging circuit 302 would then send a current pulse across ferrite module 312a, polarizing it, which would direct any signal from its waveguide arm leading to ferrite module 312b to its waveguide arm leading to ferrite module 312c. If ferrite module 312c is already polarized in a way that it will route any signal it receives to amplifier 316b, then the process is done. If, however, the ferrite module 312c is polarized in a way that it will route any signal it receives to amplifier 316a, then the polarization process is repeated with ferrite module 312c. In this example, then, any signal is routed around the faulty amplifier 316a into a standby amplifier 316b.

The systems and methods described above can be used to reduce the total number of switches and dedicated support components needed to drive a circuit with multiple ferrite modules. Instead of having two dedicated switches and dedicated support components for each ferrite module as required by conventional designs, each column of ferrite modules, in the embodiments described herein, uses as few as two switches. Similarly, each row of ferrite modules, in the embodiments described herein, uses as few as two switches. That is, one switch for each respective column or row is used for polarizing a ferrite module to a first polarity and another switch for each respective column or row is used for polarizing the ferrite module to a second polarity, opposite the first polarity. Thus, for a set of switches that can be arranged in a matrix, the number of switches is 2*(R+C), where R is the number of rows and C is the number of columns. In contrast, typical conventional designs require 2*R*C switches. As a result, the systems and methods described below can lead to cost savings for any size matrix arrangement where (R+C) is less than (R*C).

Utilizing the systems and methods described above, however, trades off speed in favor of the size and the cost of the driver by sharing components among many ferrite modules. By only switching one at a time serially instead of in a parallel fashion, the overall component count is greatly reduced. It is therefore suited to redundancy applications, which rarely need to switch and therefore can take advantage of the savings in cost and size in this new approach.

EXAMPLE EMBODIMENTS

Example 1 includes a ferrite module matrix driver circuit comprising: a controller; a charging circuit; a plurality of ferrite modules arranged in the form of a matrix; a plurality of first switches driven by the controller, wherein each switch in the first plurality of switches connects a respective column of said plurality of ferrite modules to the charging circuit; a plurality of second switches driven by the controller, wherein each switch in the second plurality of switches connects a respective row of said plurality of ferrite modules to ground; and one or more comparators coupled to the charging circuit and the controller, wherein after a specific voltage has been reached by the charging circuit, one of the one or more comparators signals to the controller, which in turn selects a specific ferrite module to be polarized by driving one of the plurality of first switches and one of the plurality of second switches.

Example 2 includes the matrix driver circuit of Example 1, wherein the plurality of ferrite modules are ferrite circulators.

Example 3 includes the matrix driver circuit of any of Examples 1-2, wherein the first plurality of switches are P-channel field-effect transistors (FETs).

Example 4 includes the matrix driver circuit of any of Examples 1-3, wherein the second plurality of switches are N-channel field-effect transistors (FETs).

Example 5 includes the matrix driver circuit of any of Examples 1-4, further comprising a plurality of diodes coupled between each of the plurality of ferrite modules and the switch of the second plurality of switches that connects the respective row of said plurality of ferrite modules to ground.

Example 6 includes a method for driving a plurality of ferrite modules wherein the ferrite modules are arranged in the form of a matrix, the method comprising: coupling a selected row of the ferrite module matrix to ground, wherein, for each ferrite module polarity, each row of ferrite modules is coupled to ground using a single respective first switch of a plurality of first switches; charging a charging circuit to a specified charging voltage; and coupling a selected column of the ferrite module matrix to the charging circuit to discharge the specified charging voltage to a selected ferrite module identified by the selected row and the selected column, wherein, for each ferrite module polarity, each column of ferrite modules is coupled to the charging circuit using a single respective second switch of a plurality of second switches.

Example 7 includes the method of Example 6, wherein charging a charging circuit includes: turning on the charging circuit; determining when the specified charging voltage has been reached by the charging circuit via an assigned comparator; and turning off the charging circuit when the specified charging voltage is reached.

Example 8 includes the method of any of Examples 6-7, wherein coupling the selected column of the ferrite module matrix to the charging circuit includes waiting a predetermined amount of time after coupling the selected column of the ferrite module matrix before decoupling the selected column.

Example 9 includes the method of any of Examples 6-8, further comprising driving each of the plurality of first switches and the plurality of second switches coupled to the ferrite module matrix open after coupling the selected column of the ferrite module matrix to the charging circuit.

Example 10 includes the method of any of Examples 6-9, further comprising verifying that the capacitor has been discharged after coupling the selected column of the ferrite module matrix to the charging circuit.

Example 11 includes the method of any of Examples 6-10, wherein each of the plurality of ferrite modules is a ferrite circulator.

Example 12 includes the method of any of Examples 6-11, wherein each respective first switch is a P-channel field-effect transistors (FETs).

Example 13 includes the method of any of Examples 6-12, wherein each respective second switch is an N-channel field-effect transistors (FETs).

Example 14 includes a ferrite module matrix driver system comprising: a controller; a charging circuit; one or more first radio frequency (RF) components; one or more second radio frequency (RF) components; a plurality of ferrite modules arranged in the form of a matrix configured to connect the one or more first radio frequency (RF) components to the one or more second radio frequency (RF) components; a plurality of first switches driven by the controller, wherein each switch in the plurality of first switches connects a respective column of said plurality of ferrite modules to the charging circuit; a plurality of second switches driven by the controller, wherein each switch in the plurality of second switches connects a respective row of said plurality of ferrites modules to ground; and one or more comparators coupled to the charging circuit and the controller, wherein after a specific voltage has been reached by the charging circuit one of the one or more comparators signals to the controller, which in turn selects a specific ferrite module to be polarized by driving one of the plurality of first switches and one of the plurality of second switches corresponding to the selected ferrite module.

Example 15 includes the system of Example 14, wherein either the one or more first radio frequency (RF) components or the one or more second radio frequency (RF) components are low-noise amplifiers (LNA).

Example 16 includes the system of any of Examples 14-15, wherein either the one or more first radio frequency (RF) components or the one or more second radio frequency (RF) components are antennas.

Example 17 includes the system of any of Examples 14-16, wherein the plurality of ferrite modules are ferrite toroids.

Example 18 includes the system of any of Examples 14-17, wherein each of the plurality of second switches driving the rows of the ferrite module matrix are P-channel field-effect transistors (FETs).

Example 19 includes the system of any of Examples 14-18, wherein each of the plurality of first switches driving the columns of the ferrite module matrix are N-channel field-effect transistors (FETs).

Example 20 includes the system of any of Examples 14-19, further comprising a plurality of diodes coupled between each of the plurality of ferrite modules and the switch of the second plurality of switches that connects the respective row of said plurality of ferrite modules to ground.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A ferrite module matrix driver circuit comprising:
    a controller;
    a charging circuit;
    a plurality of ferrite modules arranged in the form of a matrix;
    a plurality of first switches driven by the controller, wherein each switch in the plurality of first switches connects a respective column of said plurality of ferrite modules to the charging circuit;
    a plurality of second switches driven by the controller, wherein each switch in the plurality of second switches connects a respective row of said plurality of ferrite modules to ground; and
    one or more comparators coupled to the charging circuit and the controller, wherein after a specific voltage has been reached by the charging circuit, one of the one or more comparators is configured to provide a signal to the controller indicating that the specific voltage has been reached by the charging circuit;
    wherein upon receiving the signal from one of the one or more comparators indicating that the specific voltage has been reached by the charging circuit, the controller is configured to select a specific ferrite module to be polarized by driving one of the plurality of first switches and one of the plurality of second switches.

2. The matrix driver circuit of claim 1, wherein the plurality of ferrite modules are ferrite circulators.

3. The matrix driver circuit of claim 1, wherein the plurality of first switches are P-channel field-effect transistors (FETs).

4. The matrix driver circuit of claim 1, wherein the plurality of second switches are N-channel field-effect transistors (FETs).

5. The matrix driver circuit of claim 1, further comprising a plurality of diodes coupled between each of the plurality of ferrite modules and the switch of the plurality of second switches that connects the respective row of said plurality of ferrite modules to ground.

6. A method for driving a plurality of ferrite modules wherein the ferrite modules are arranged in the form of a matrix, the method comprising:
    coupling a selected row of the ferrite module matrix to ground using a controller, wherein, for each ferrite module polarity, each row of ferrite modules is coupled to ground using a single respective first switch of a plurality of first switches;
    charging a charging circuit to a specified charging voltage; and
    upon receiving a signal from a comparator indicating that the specific charging voltage has been reached by the charging circuit, coupling a selected column of the ferrite module matrix to the charging circuit using the controller, wherein coupling discharges the specified charging voltage and polarizes a selected ferrite module identified by the selected row and the selected column, wherein, for each ferrite module polarity, each column of ferrite modules is coupled to the charging circuit using a single respective second switch of a plurality of second switches.

7. The method of claim 6, wherein charging a charging circuit includes:
    turning on the charging circuit;
    determining when the specified charging voltage has been reached by the charging circuit via an assigned comparator; and
    turning off the charging circuit when the specified charging voltage is reached.

8. The method of claim 6, wherein coupling the selected column of the ferrite module matrix to the charging circuit includes waiting a predetermined amount of time after coupling the selected column of the ferrite module matrix before decoupling the selected column.

9. The method of claim 6, further comprising driving each of the plurality of first switches and the plurality of second switches coupled to the ferrite module matrix open after coupling the selected column of the ferrite module matrix to the charging circuit.

10. The method of claim 6, further comprising verifying that the capacitor has been discharged after coupling the selected column of the ferrite module matrix to the charging circuit.

11. The method of claim 6, wherein each of the plurality of ferrite modules is a ferrite circulator.

12. The method of claim 6, wherein each respective first switch is a P-channel field-effect transistors (FETs).

13. The method of claim 6, wherein each respective second switch is an N-channel field-effect transistors (FETs).

14. A ferrite module matrix driver system comprising:
    a controller;
    a charging circuit;
    one or more first radio frequency (RF) components;
    one or more second radio frequency (RF) components;
    a plurality of ferrite modules arranged in the form of a matrix configured to connect the one or more first radio frequency (RF) components to the one or more second radio frequency (RF) components;

a plurality of first switches driven by the controller, wherein each switch in the plurality of first switches connects a respective column of said plurality of ferrite modules to the charging circuit;

a plurality of second switches driven by the controller, wherein each switch in the plurality of second switches connects a respective row of said plurality of ferrites modules to ground; and one or more comparators coupled to the charging circuit and the controller, wherein after a specific voltage has been reached by the charging circuit, one of the one or more comparators is configured to provide a signal to the controller indicating that the specific voltage has been reached by the charging circuit;

wherein upon receiving the signal from one of the one or more comparators indicating that the specific voltage has been reached by the charging circuit, the controller is configured to select a specific ferrite module to be polarized by driving one of the plurality of first switches and one of the plurality of second switches corresponding to the selected ferrite module.

15. The system of claim 14, wherein either the one or more first radio frequency (RF) components or the one or more second radio frequency (RF) components are low-noise amplifiers (LNA).

16. The system of claim 14, wherein either the one or more first radio frequency (RF) components or the one or more second radio frequency (RF) components are antennas.

17. The system of claim 14, wherein the plurality of ferrite modules are ferrite toroids.

18. The system of claim 14, wherein each of the plurality of second switches driving the rows of the ferrite module matrix are P-channel field-effect transistors (FETs).

19. The system of claim 14, wherein each of the plurality of first switches driving the columns of the ferrite module matrix are N-channel field-effect transistors (FETs).

20. The system of claim 14, further comprising a plurality of diodes coupled between each of the plurality of ferrite modules and the switch of the plurality of second switches that connects the respective row of said plurality of ferrite modules to ground.

* * * * *